United States Patent [19]

Gärtner et al.

[11] Patent Number: 4,877,642

[45] Date of Patent: Oct. 31, 1989

[54] METHOD OF MANUFACTURING ELECTRICALLY CONDUCTIVE MOLDED BODIES BY PLASMA-ACTIVATED CHEMICAL DEPOSITION FROM THE GASEOUS PHASE

[75] Inventors: Georg F. Gärtner, Aachen; Hans-Jürgen Lydtin, Stolberg, both of Fed. Rep. of Germany

[73] Assignee: U.S. Philips Corp., New York, N.Y.

[21] Appl. No.: 69,476

[22] Filed: Jul. 2, 1987

[30] Foreign Application Priority Data

Jul. 5, 1986 [DE] Fed. Rep. of Germany ....... 3622614

[51] Int. Cl.⁴ .................. B05D 3/06; B05D 5/12; B05D 7/22
[52] U.S. Cl. .................................... 427/38; 427/45.1; 427/105; 427/237; 427/239
[58] Field of Search .................. 427/45.1, 38, 39, 105, 427/237, 239

[56] References Cited

U.S. PATENT DOCUMENTS

| | | | |
|---|---|---|---|
| 4,349,582 | 9/1982 | Beerwald et al. | 427/38 |
| 4,401,054 | 8/1983 | Matsuo et al. | 427/45.1 |
| 4,473,596 | 9/1984 | Beerwald et al. | 427/38 |
| 4,513,021 | 4/1985 | Purdes et al. | 427/38 |
| 4,533,852 | 8/1985 | Frank et al. | 445/50 |
| 4,585,668 | 4/1986 | Asmussen et al. | 427/45.1 |
| 4,713,259 | 12/1987 | Gärtner et al. | 427/105 |
| 4,714,589 | 12/1987 | Auwerda et al. | 427/45.1 |

FOREIGN PATENT DOCUMENTS 2030180 4/1980 United Kingdom .

Primary Examiner—Norman Morgenstern
Assistant Examiner—M. L. Padgett
Attorney, Agent, or Firm—Ernestine C. Bartlett

[57] ABSTRACT

Layers of electrically conductive material are deposited in a standing microwave field. The deposition is done on an electrically conductive substrate in which a part of the surface forms a part of the inner wall of a microwave cavity resonator. As a result of this the microwave energy is used optimally. Measures are taken to keep the coupling place of the microwave ("window") free from an electrically conductive growth. The substrate is preferably moved periodically or aperiodically relative to the plasma and the remaining walls of the resonator.

13 Claims, 3 Drawing Sheets

METHOD OF MANUFACTURING ELECTRICALLY CONDUCTIVE MOLDED BODIES BY PLASMA-ACTIVATED CHEMICAL DEPOSITION FROM THE GASEOUS PHASE

FIELD OF THE INVENTION

The invention relates to a method of manufacturing a shaped body of at least an electrically conductive material by a plasma-activated chemical deposition of the material, from a gaseous phase comprising at least a starting compound of the material, on a substrate consisting of a second electrically conductive material, which substrate is then removed.

BACKGROUND OF THE INVENTION

Such a method is known from the published German Patent Application No. 31 48 441, which corresponds to U.S. Pat. No. 4,533,852, in which the molded body manufactured in this manner is a thermionic cathode. The substrate used in this method is formed in accordance with the desired cathode geometry. The substrate is, for example, a hollow cylinder and consists, for example of copper, nickel, iron, molybdenum or alloys thereof. A layered structure of a high-melting-point metal, for example, tungsten, molybdenum, tantalum, niobium, platinum, osmium, ruthenium, rhodium, rhenium, iridium or palladium, as well as optional emitter and doping materials, is provided on the substrate, for example, by chemical depositin from the gaseous phase (CVD method). As starting compounds of the metals are used, for example, the halides, carbonides, trifluorophosphanes, metallocenes, $\beta$-diketonates and alcoholates thereof. The chemical deposition from the gaseous phase is caused, for example, by a plasma (for example in a plasma-activated CVD method commonly referred to in the art as the PCVD method). The subsequent removal of the substrate is carried out, for example, by etching, mechanical working and/or evaporation by heating.

A plasma deposition device is known from the published German Patent Application No. 31 17 252, which corresponds to U.S. Pat. No. 4,401,054, which comprises a plasma generator space as well as a sample space arranged so as to be separated therefrom, the plasma generator space being, for example, shaped and proportioned so that it satisfies the conditions of a microwave cavity resonator. The substrate to be coated is present outside the resonator in the sample space in which the plasma is extracted at least partly. The layers deposited on the substrate consist in particular of insulators, for example, silicon nitride and silicon dioxide or semiconductors, for example, silicon; electrically conductive materials, for example, molybdenum silicide and molybdenum, however, are also mentioned. Although the plasma in the sample space is accelerated under the effect of a diverging magnetic field, only very thin layers are produced at very low deposition rates.

The published British Patent Application No. 20 30 180 discloses an ion coating method, i.e. a method in which ions are formed and are accelerated towards the substrates to be coated by a high electric direct voltage field. The reaction space is formed by an electrically conductive tube and two insulating plugs with which the ends of the tube are closed. The inner wall of the tube constitutes the substrate to be coated. A plasma is produced in the reaction space by a direct current and-/or high frequency discharge between the tube which is connected as the outer electrode and a thin tubular inner electrode which extends concentrically through the plugs in the whole reaction space. The electrical insulation between the tube and the inner electrode achieved by use of the insulating plugs is essential. The gaseous phase is decomposed by pyrolysis or chemical reduction, but microwaves or photolysis may also be used. In the case of the decomposition of the gaseous phase by microwaves, the microwaves should be radiated into the reaction space or be introduced into the reaction space via a waveguide. In this known method only a fraction of the microwave energy is used. Moreover, the microwave coupling ends after a short period and only very thin layers, i.e. approximately 1 $\mu$m thick, are formed since the microwaves are coupled into the airtight-sealed reaction space implicitly via a dielectric, i.e. via the insulating plugs. The surface of the dielectric in the reaction space is inevitably also coated with the electrically conductive material so that further coupling is prevented.

An object of the invention is to deposit electrically conductive layers with optimum use of the microwave energy and to enable the production of longer-lasting coatings so that overall thicknesses of approximately 10 $\mu$m or more are reached.

SUMMARY OF THE INVENTION

According to the invention this object is achieved by providing a method of manufacturing a shaped body of at least an electrically conductive material by a plasma-activated chemical deposition of the material from a gaseous phase onto a substrate consisting of a second electrically conductive material wherein the gaseous phase is introduced into a reaction space which is formed as a microwave cavity resonator whose inner wall consists partly of at least a part of the substrate on which the electrically conductive material is deposited, and that microwaves are applied to the reaction space at a site, for example, at a coupling place (or at coupling places) which is kept free from growing electrically conductive material, said microwaves producing a standing microwave field in the reaction space.

The standing microwave field is produced in that the reaction space is proportioned geometrically in such a manner that its spatial dimensions satisfy the condition for resonance for a given wave type of the microwave with frequency $\nu = c/\lambda$, where c is the velocity of light and $\lambda$ is the wavelength. This means that the reaction space is constructed so that it operates as a microwave cavity resonator. In other words this means that the frequency of the microwaves applied to the cavity resonator, i.e. the reaction space, is made to match one of the resonance frequencies of the resonator. Further details of this proportioning and operation of cavity resonators are described in the books by H. Franke (publisher) "Lexikon der Physik" (Stuttgart 1961) pp. 1405–1406 and H. Püschner "Wärme durch Mikrowellen" (Eindhoven 1964) pp. 175–201.

The invention is hence based on the idea of intensifying the activation of the chemical deposition from the gaseous phase by the microwave plasma in that the substrate to be coated is part of the inner wall of a specially constructed microwave resonator. As a result of this the process can be carried out at pressures higher than those according to the DE-OS 31 17 252 and deposition rates up to 100 times higher can be achieved.

The geometrical dimensions of the resonator arise from the dimensions of the substrate, from the choice of the type of resonator and the desired mode of oscillation, in which, of course, certain preferences may exist in accordance with a certain application.

Preferably a single very special resonator mode is obtained via a suitably chosen tunable coupling device from a waveguide guiding the microwaves. In other words, a tunable coupling device from a waveguide guiding the microwaves is excited in a single, selected resonator mode. It is advantageous that a transversal electrical wave type ($TE_{nmp}$ wave type) is excited in which a bulge or several bulges of the electric field vectors of the microwave terminating at right angles to the surface of the substrate extend along the substrate. As a result of this the highest plasma densities are formed at the surface of the substrate.

For the reaction space operate optimally as a microwave cavity resonator, it is advantageous in the geometrical construction of the reaction space to keep tolerances in the order of magnitude of 0.1 mm. Furthermore, the shape, smoothness and electrical conductivity of the inner wall of the reaction space are of importance for the optimum operation of the resonator.

Layers of electrically conductive material are preferably deposited on the inner wall of a rotationally symmetrical cavity resonator. In such a resonator, a mode structure is formed, as a matter of fact, which makes the resonator insensitive to a variation of the cavity diameter as a result of the layers growing during the deposition. Rectangular and spherical cavity resonators, however, are also very suitable.

The Q-factor of the cavity resonator is preferably at least 100, however, in some embodiments of the method according to the invention Q-factors of 50 000 are reached. The Q-factor is to be understood to mean the quotient of coupled power to loss power per period. Further details are described in the above-mentioned books.

As the geometrical dimensions change during the process, for example, because layers grow during the deposition, it is in many cases advantageous to keep the microwave frequency and the resonator frequency for the chosen wave type resonating during deposition by mechanical and/or electrical retuning. This is done, for example, by adapting the frequency of the microwave transmitter via a control track at which returning is done at minimum reflected power and, for example, an intermittent frequency wobbling.

With longer duration of the method according to the invention, as, for example, in the manufacture of layer thicknesses in the order of magnitude from 20 to 100 $\mu m$, which optionally consist of several components, short circuits may occur because electrically conductive layers also grow at the coupling places, at which microwave energy is applied to the reaction space. For this reason, it is necessary to apply measures to keep the coupling places free from growing electrically conductive layers. This is done, for example, by applying a rinsing gas, for example, helium-group gas, such as argon, to the coupling place. Another possibility is to install a selectively non-coatable insulator at the coupling place, at the surface to the reaction space of which an etching reaction occurs instead of a coating.

In a further preferred form of the method according to the invention in which the length of the substrate is greater than the length of the resonator, this substrate is moved periodically or aperiodically relative to the plasma and the remaining wall of the reaction space. By the movement during the deposition a very good homogenization of the deposited layers is obtained. Moreover, the substrate area on which the deposition is carried out is enlarged. A further advantage of this embodiment is that in the production of homogeneous layers by the reciprocating movement of a rather long substrate relative to the resonator, the plasma expansion remains constant also with increase in power and long outer tapers, i.e. expanded areas of deviating thickness, do not occur.

It is furthermore advantageous to keep the apertures in the cavity resonator for gas inlet, gas outlet, microwave coupling; and optionally sliding contact connection for the movement as small as possible. It has also been found that when the microwave power in the resonator is considerably increased, no noteworthy leakage of microwaves occurs and the taper and the deposited layer always remains constant and smaller than the actual longitudinal expansion of the cavity resonator reaction space.

The removal i.e. the detaching of the deposited layers and the molded body, respectively, from the substrate is carried out according to known methods such as they are described, for example, in the published German Patent Application No 31 48 441 or U.S. Pat. No. 4,533,852.

Any of the known starting comounds mentioned hereinbefore, but also metal-heptafluorodimethyloctanedionates and metal-acetylacetonates, may be used as starting mixtures to manufacture the material structures mentioned hereinbefore, for example, also including those which comprise carbides and oxides, for example, tungsten carbide and thorium oxide.

The cavity resonator preferably consists of steel or copper.

Self-supporting molded bodies or layers of any type are manufactured by means of the method according to the invention, in particular for high temperature applications. Examples of such bodies or layers are not only the thermionic cathodes and filament cathodes mentioned hereinbefore but also high-melting-point tubes for various applications, for example, walls of plasma chambers, inner tubes of high-power lasers and coatings in the interior of nuclear reactors.

BRIEF DESCRIPTION OF THE DRAWINGS

The invention will now be described in greater detail with reference to a drawing and examples for the manufacture of self-supporting metallic cylinders, in which.

DETAILED DESCRIPTION OF THE PREFERRED EMBODIMENTS

EXAMPLE 1

Figure 1:
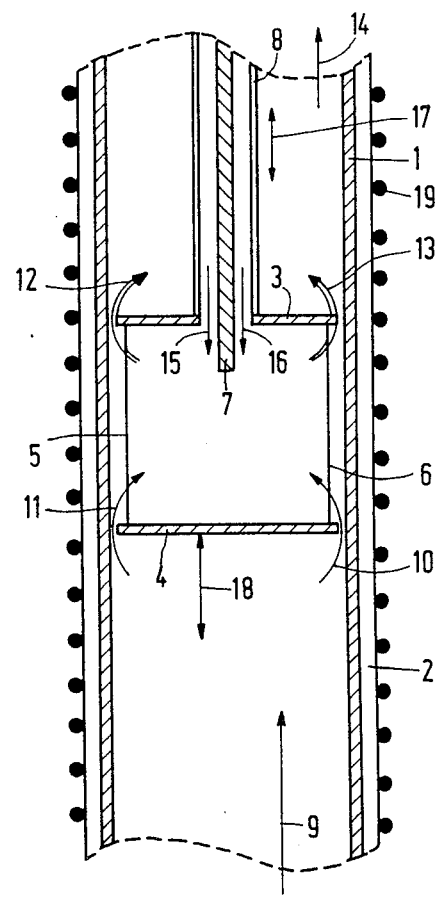
FIG. 1 is a diagrammatic sectional view of a deposition device with a cylindrical microwave cavity resonator.

A cylindrical microwave cavity resonator, as is shown diagrammatically in FIG. 1, is used for the manufacture of a metallic cylinder having an outside diameter D of 30 mm and length L of 23.3 mm in which the typical coating thickness to be achieved, i.e. the wall thicknesses of the molded body, are to be between 50 μm and 20 μm. The outer wall of the cylindrical cavity resonator is formed by a substrate tube 1 which serves as a substrate for the deposition and which is provided in a reactor tube 2 so as to fit readily, which tube is optimally composed of individual cylinders. Two resonator end plates 3 and 4 are connected by two spacer rods 5 and 6 (or are reciprocated from both sides with a constant distance from each other, without spacer rods) and have a wall spacing of approximately 0.2 to 0.5 mm. In the upper resonator end plate 3 a coupling place in the form of a coupling pin 7 is present. The coupling occurs via a coaxial lead 8 whose inner conductor, namely the coupling pin 7, extends axially slightly into the resonator and thus produces the excitation of $TM_{011}$ mode. The resonator end plates may additionally be perforated for the inflow and outflow. The pin 7 may simultaneously be used to ignite the plasma at the beginning by a direct current discharge. From a gas supply (indicated by an arrow 9) the reactive gases flow through the gap between the substrate tube 1 and the resonator end plate 4 into the resonator, as indicated by the arrows 10 and 11, and, as indicated by the arrows 12 and 13, are pumped away to the gas outlet which is indicated by an arrow 14. The coaxial lead 8 is rinsed in the intermediate space between the inner and outer conductors by an inert rinsing gas (indicated by two arrows 15 and 16) which also flows into the resonator and, as indicated by the arrows 12 and 13, is removed by pumping. When the reactive gases are, for example, $WF_6$ and $H_2$, a hard or soft glass window (not shown) may be used as the coupling place which is not coated due to the etching reaction with the formed HF. The coaxial line 8 and the resonator end plates 3 and 4 are periodically reciprocated in the axial direction in the substrate tube 1, which is indicated by arrows 17 and 18. Heating windings 19 which enable an additional heating of the substrate tube may additionally be provided on the outer wall of the reactor.

Figure 2:
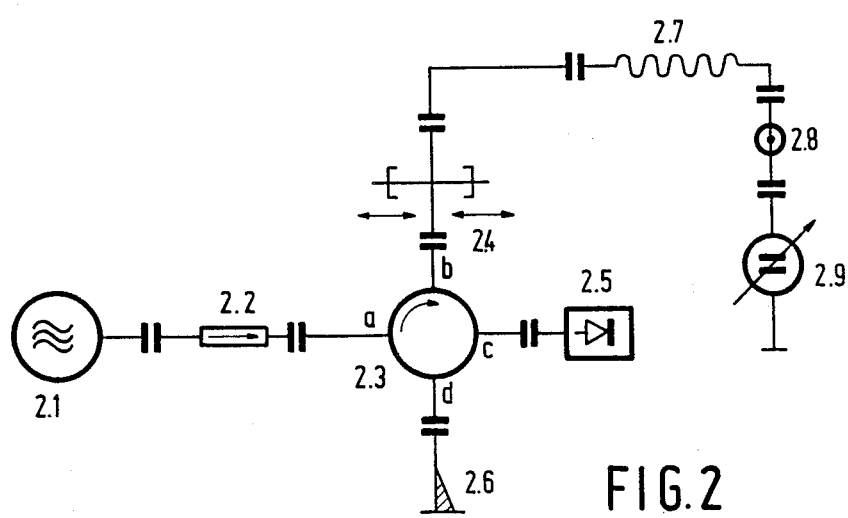
FIG. 2 shows a circuit diagram for a deposition device.

FIG. 2 shows the circuit diagram of the microwave construction belonging to FIG. 1 and the above example, respectively. From a resonator 2.1 (for example a klystron or carcinotron) microwave power reaches a four-way circulator 2.3 via an insulator 2.2, where the power reaching a branch b is tuned via an E-H tuner 2.4 so that the power coupled in the cavity resonator 2.9 with the microwave plasma via a flexible waveguide section 2.7 and a coaxial line 2.8 becomes maximum. This means that the tuning of the E.H. tuner 2.4 occurs in such a manner that the power demonstrated in a detector diode 2.5 becomes minimum. Microwaves reflected from a branch c to a branch d are absorbed in a waveguide termination 2.6 and do not return to the generator 2.1. The insulator 2.2 serves as an additional return loss so that the stability of the resonator is not disturbed. The same construction may otherwise also be used for the following example 2.

EXAMPLE 2

For the proportioning of the device shown in FIG. 1 and also with reference to the choice of the excitation frequency the following numerical example is given. Starting, for example, from a ratio D/L of 1:1.29, it follows from the mode cards in Baden-Fuller "Mikrowellen" p. 101 that the condition:

$$(f.D)^2 = 9.10^{16} \, m^2 \cdot Hz^2$$

applies to the $TM_{011}$ mode. For D=30 mm it then follows that $f = 3.10^8$ Hz.m/0.03 m = $10^{10}$ Hz. Thus, the excitation then occurs with a tunable X-band generator having a frequency in the range of 10 GHz with typical powers between 100 and 300 Watt CW.

The same result for the proportioning of the resonator may also be obtained differently. One condition is again that D=30 mm. From this condition first the boundary wavelengths λ TM/G nm for different wave types $TM_{nm}$ can be determined. It holds that $$\lambda \frac{TM}{G} nm = \frac{2\pi v}{\gamma \, nm}$$

where γnm indicates the $n^{th}$ zero position of the Bessel function $I_n$. For $TM_{01}$ it holds that $\gamma_{01} = 2.405$ and hence $$\lambda_G = \frac{2\pi \cdot 1.5 \, cm}{2.405 \, cm} = 3.919 \, cm.$$

This means that in such a waveguide only waves of this type having a vacuumlength $\lambda < \lambda_G$ can be expanded. So it holds that $v > v_G = C/\lambda G$ for the frequency of the microwave. If according to this condition $v$ is set at 10.0 GHz it is obtained as a waveguide wavelength for the $TM_{01}$ type in the circular cylindrical waveguide $$\Lambda = \frac{\lambda}{\sqrt{1 - (\lambda/\lambda_G)^2}}$$

or =4.663 cm. The resonance condition for the circular cylindrical cavity resonator now implies that L=p. /2, i.e. the height L of the cylinder must be a whole integer of /2. For the $TM_{011}$ oscillation this means per definition that $L_1 = 2.331$ cm, for $TM_{012}$ accordingly $L_2 = 4.663$ cm. It is to be noted that the resonator (d, $L_1$) not only has a given natural frequency but in accordance with the mode type excitation totally an enumerable infinite succession of natural frequencies. For example, for the above resonator the resonant frequency for the $TM_{010}$ mode is $vTM_{010} \approx 7.61$ GHz and for the $TE_{111}$ mode 8.43 GHz. (compare: G. Klages "Einführung in die Mikrowellenphysik" (Darmstadt 1967)).

EXAMPLE 3

Figure 3A:
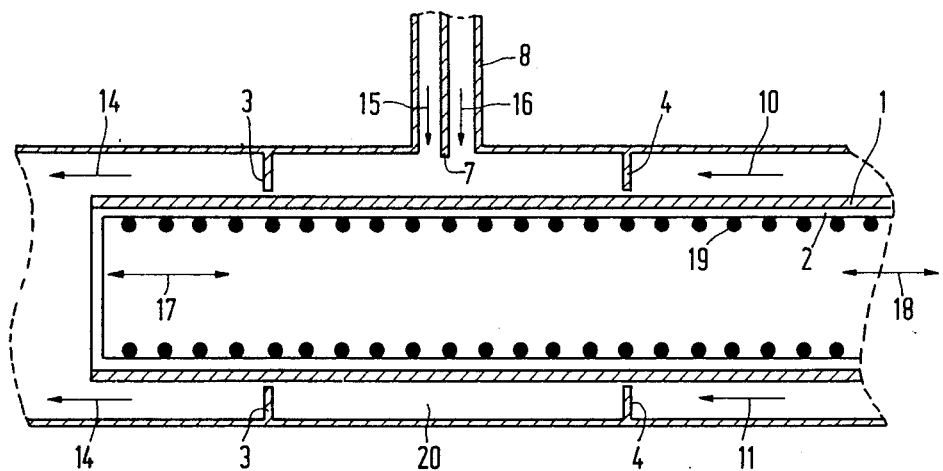
FIG. 3a is a diagrammatic sectional view of a deposition device with a coaxial microwave cavity resonator.
Figure 3B:
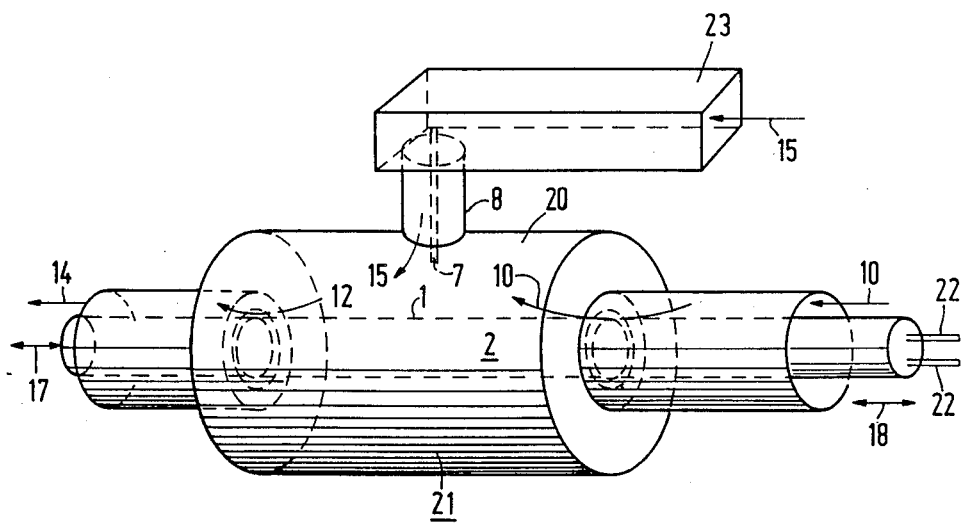
FIG. 3b is a perspective view of the device shown in FIG. 3a, and FIG. 4 shows an alternative of the circuit diagram shown in FIG. 2.

A coaxial microwave resonator is used as is shown in FIGS. 3a and 3b. In this case the resonator outer wall 20 with the end plates 3 and 4 is stationary and the inner cylinder 2 on which the substrate tubes 1 are present is reciprocated periodically through the resonator, the stroke being a multiple of the resonator length. The reactive gases (arrows 10 and 11) flow into the resonator 21 through the annular slot between the end plates 3 and 4 and the substrate tube 1. The inner tube 2 is preheated by heating windings 19 with heating current supplies 22. The gases are removed by pumping (arrow 12) through the corresponding annular slot on the oppositely located resonator side. For producing the electric contact between the substrate tube 1 and the resonator end plates 3 and 4 it is recommendable to provide a brush-like sliding contact (not shown) between the substrate tube and the resonator end plates which moreover produces a fine-granular deposition. The microwave power is appied, via a rectangular waveguide 23 and a coaxial connection member 8, to the resonator 21 in which the plasma burns. For exciting the TEM basic oscillation (Lecher type) of the coaxial resonator serves the elongated inner conductor of the coaxial line as a coupling pin 7 in the radial direction.

Other couplings, however, are also possible, for example, through a coupling hole or by a connection of the coaxial inner conductor to the resonator outer wall in the plane at right angles to the axis. In this case a longitudinal H field and hence again a transversal electric microwave field is excited. The lowest TE modes are to be preferred since only the E field components to the surface are desired and E ring fields can be used effectively for the directed ion movement only via VxE and ExH drift movements. Of course the method may also be carried out with TM modes. In accordance with the aiming direction longer diffusion paths and an increase of the number of impacts in the gas spaced can be achieved with suitable higher modes. Higher modes have the advantage that the stroke of the relative movement can be reduced, since several local increased plasma concentrations then exist in the field crossings and as a result of this a more rapid (thickness and concentration) profile compensation occurs. For the proportioning the following boundary conditions apply:

When the radius of the inner cylinder is $r_i$, the radius of the outer cylinder of the resonator is $r_a$ and the resonator length is L, it applies as a condition only for the TEM mode, i.e. pure transversal electrical field and pure transversal magnetic field, that $\pi.(r_i+r_a)<\lambda_0$ and $L=n.\lambda/2$ (compare G. Nimtz "Mikrowellen" (Müchen 1980) p .39).

For $r_i=1.5$ cm and $r_a=1.5$ $r_i \lambda_0 > 11.2$ cm or $v_0 < 2.7$ GHz is obtained. With $v_0=2.45$ GHz it then follows that $L=\frac{1}{2}$. $\lambda_0=6.1$ cm. This choice of $v_0$ has purely technical reasons. When instead of $r_a=1.5$ $r_i$ the optimum value as regard Q-factor of $r_a=3.6$ $r_i$ is used, one obtains as a frequency condition $v_0<1.4$ GHz and L becomes twice as large, which, as regards the spatial plasma concentration, is then less favourable. If instead of this a larger local plasma concentration in the basic mode is to be achieved and, for example, a substrate tube diameter $r=1.5$ cm is fixed, $r_a=1.5$ cm and $r_i=0.5$ cm may now be chosen. The substrate tube which now is, for example, fixed, now serves as the outer cylinder and is additionally heated from without. The thin inner tube remains unheated and serves as a coaxial or round waveguide for supplying the microwave energy to the resonator in whose centre the coupling rinsed with inert gas is present and whose end plates are rigidly connected to the inner tube. The inner tube with the end plates is now reciprocated periodically. The reactive gases flow through the annular slot between end plates and substrate tube into the resonator and are then also removed by suction on the other side. With the above dimensions it is now obtained that $\pi.(r_i+r_a)=6.28$ cm$<\lambda_0$ or $v_0<4.77$ GHz With $v_0=4.7$ GHz it then follows for the TEM basic mode that $L=3.2$ cm. Thus with the arrangement a better local plasma concentration has been reached.

Figure 4:
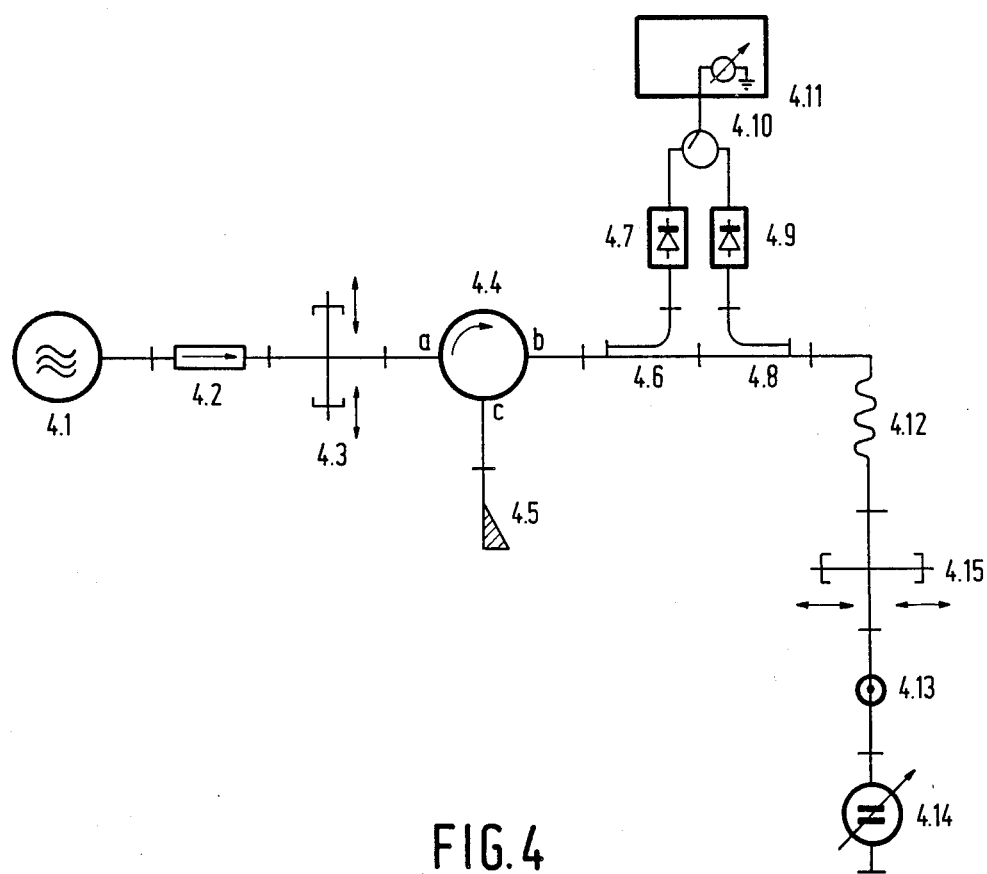

FIG. 4 shows an alternative of the microwave construction as shown in FIG. 2. It is advantageous that reciprocating waves must be measured separately and the power consumed in the resonator can thus be determined. From a generator 4.1, for example a magnetron or clystron, microwave power reaches a three-way circular 4.4 (input a) via an insulator 4.2 and an E.H tuner 4.3. The microwaves coupled out in the output b reach a cavity resonator 4.14 which is identical to the reaction space (of a plasma chamber) via a flexible waveguide member 4.12 and a coaxial waveguide 4.13.

It is recommendable to use a further E-H tuner 4.15 (and a pin transformer or a pinched line, respectively,) before the resonator. The determination of the power coupling in the plasma occurs via the two 20 dB directional couplers for forward (4.6) and return (4.8) and the two detectors 4.7 and 4.9. In a standing wave meter and a power measuring device 4.10, respectively, either the difference signal between the forward and reflected microwave can be directly formed or there is switched forward and backwards via a switch between the two detectors. The power reflected on the track to the resonator flows from b to c and is absorbed in a waveguide termination 4.5.

Typical deposition conditions, for example, for a $W+ThO_2$ deposition are: $WF_6$ flow rate 10 to 60 sccm (=cm$^3$ per minute related to normal conditions (0° C., 1013 hPa)). $H_2$ flow rate 100 to 600 sccm, Ar flow 100 to 400 sccm, saturator temperature 140° C., saturator filling Th tetrakis-(heptafluorodimethyloctanedionate), substrate tube temperature 250° to 500° C., overall pressure in the reactor 5 to 30 hPa.

With respect to the resonator configuration there are a series of combination possibilities, for example, of several resonators with several reactive filling gas compositions which are moved collectively over the common substrate tube to achieve a desired layer structure.

A further variation consists in that in conditions suitable for very high or substantially quantitative yields the rinsing gas for the microwave supplies is omitted and instead of this exhaustion is carried out via the coupling place.

The method according to the invention may be used in any electrically conductive layer structure which can be manufactured by CVD methods and hence permits the manufacture thereof by microwave plasma-activated CVD methods.

Summarizing, the invention consists in that electrically conductive layers and molded bodies are deposited in a standing microwave field by microwave plasma-activated chemical deposition from the gaseous phase. The deposition occurs on an electrically conductive substrate in which a part of the surface forms a part of the inner wall of a microwave cavity resonator. As a result of this the microwave energy is used optimally. Measures are taken to keep the coupling place of the microwave ("window") free from an electrically conductive growth. The substrate is preferably moved periodically or aperiodically relative to the plasma and to the remaining wall of the resonator.

What is claimed is:

1. A method of manufacturing a shaped body of at least an electrically conductive material by a plasma-activated chemical deposition of the material, from a gaseous phase comprising at least a starting compound of the material, onto a substrate consisting of a second electrically conductive material which substrate is then removed from the deposited material after completion of deposition of the material wherein:

(a) the gaseous phase of an electrically conductive material is introduced into a reaction space formed as a microwave cavity resonator whose inner wall comprising at least a part of the substrate on which the electrically conductive material is deposited;

(b) the microwaves are applied at a site in the reaction space which is kept free from growing layers of electrically conductive material;
(c) the microwaves produce a standing microwave field in the reaction space; and
(d) electrically conductive material is deposited on the inner wall of said resonator.

2. A method as claimed in claim 1 wherein the frequency of the microwaves applied to the reaction space is made to match one of the resonant frequencies of the reaction space formed as a microwave cavity resonator.

3. A method as claimed in claim 2, wherein a tunable coupling device from a waveguide guiding the microwaves is excited in a single, predetermined resonator mode.

4. A method as claimed in claim 3, wherein a transversal electric wave type ($TE_{nmp}$-wave type) is excited in which a bulge or several bulges of the electric field vectors of the microwave terminating at right angles to the surface of the substrate extend along the substrate.

5. A method as claimed in claim 1, wherein said microwave cavity resonator is rotationally symmetrical and layers of an electrically conductive material are deposited on the inner wall of said resonator.

6. A method as claimed in claim 1, wherein said microwave cavity resonator is rectangular and the layers are deposited on the inner wall of said resonator.

7. A method as claimed in claim 1, wherein said microwave cavity resonator is spherical and the layers are deposited on the inner wall of said resonator.

8. A method as claimed in claim 5, 6, or 7, wherein the cavity resonator has a Q-factor of at least 100.

9. A method as claimed in claim 2 or 3, wherein the microwave frequency and the resonator frequency for the selected wave type are kept resonating by mechanical and/or electrical retuning during the deposition.

10. A method as claimed in claim 1, wherein the reaction space comprises a coupling place at which microwave energy is applied, said coupling place being kept free from deposition of electrically conductive layers by introducing a rinsing gas in said coupling place or by incorporating a selective insulator at said coupling place which cannot be coated.

11. A method as claimed in claim 1, wherein the substrate is elongated outwards and is moved periodically or aperiodically relative to the plasma and the remaining wall of the reaction space.

12. A method as claimed in claim 1 or 11, wherein cavity resonator is used whose apertures for gas inlet, gas outlet, microwave coupling and optionally sliding contact connection for the movement are kept as small as possible.

13. A method of manufacturing a shaped body of at least an electrically conductive material by a plasma-activated chemical deposition of the material, from a gaseous phase comprising at least a starting compound of the material, onto a substrate consisting of a second electrically conductive material which substrate is then removed from the deposited material after completion of deposition of the material wherein:
(a) the gaseous phase of an electrically conductive material is introduced into a reaction space formed as a microwave cavity resonator whose inner wall comprises at least a part of the substrate on which the electrically conductive material is deposited;
(b) the microwaves are applied at a site in the reaction space which is kept free from growing layers of electrically conductive material;
(c) the microwaves produce a standing microwave field in the reaction space; and
(d) electrically conductive material is deposited on the inner wall of said resonator
wherein deposition rates are obtained that are substantially higher than those obtained when said microwave cavity resonator does not comprise at least a part of the substrate on which the electrically conductive material is deposited.

* * * * *